(12) United States Patent
Yan et al.

(10) Patent No.: US 12,007,250 B2
(45) Date of Patent: Jun. 11, 2024

(54) VARIABLE SYNTHETIC WAVELENGTH ABSOLUTE DISTANCE MEASURING DEVICE LOCKED TO DYNAMIC SIDEBAND AND METHOD THEREOF

(71) Applicant: ZHEJIANG SCI-TECH UNIVERSITY, Zhejiang (CN)

(72) Inventors: Liping Yan, Zhejiang (CN); Jiandong Xie, Zhejiang (CN); Benyong Chen, Zhejiang (CN)

(73) Assignee: ZHEJIANG SCI-TECH UNIVERSITY, Zhejiang (CN)

( * ) Notice: Subject to any disclaimer, the term of this patent is extended or adjusted under 35 U.S.C. 154(b) by 295 days.

(21) Appl. No.: 17/623,611

(22) PCT Filed: Aug. 7, 2020

(86) PCT No.: PCT/CN2020/107743
§ 371 (c)(1),
(2) Date: Dec. 29, 2021

(87) PCT Pub. No.: WO2021/227265
PCT Pub. Date: Nov. 18, 2021

(65) Prior Publication Data
US 2022/0260368 A1    Aug. 18, 2022

(30) Foreign Application Priority Data
May 12, 2020 (CN) .......................... 202010396830.6

(51) Int. Cl.
*G01C 3/02* (2006.01)
*G01B 9/02001* (2022.01)
(Continued)

(52) U.S. Cl.
CPC ........... *G01C 3/02* (2013.01); *G01B 9/02004* (2013.01); *G01B 9/0201* (2013.01); *G01B 11/02* (2013.01);
(Continued)

(58) Field of Classification Search
CPC .... G01C 3/02; G01B 9/02004; G01B 9/0201; G01B 11/02; G02B 27/12; G02B 27/283; G02F 1/21; G02F 2203/50; H01S 5/0687
(Continued)

(56) References Cited

U.S. PATENT DOCUMENTS 5,402,236 A    3/1995  Brown et al.
5,631,736 A *  5/1997  Thiel ................... G01B 9/0207
                                                    356/486
(Continued)

FOREIGN PATENT DOCUMENTS

CN    102168944    8/2011
CN    103986053    8/2014
(Continued)

OTHER PUBLICATIONS

"International Search Report (Form PCT/ISA/210) of PCT/CN2020/107743", mailed on Jan. 28, 2021, pp. 1-5.
(Continued)

*Primary Examiner* — Michelle M Iacoletti
*Assistant Examiner* — Noah J. Haney
(74) *Attorney, Agent, or Firm* — JCIPRNET

(57) ABSTRACT

A variable synthetic wavelength absolute distance measuring device locked to a dynamic sideband and a method thereof are disclosed. A high-frequency electro-optic phase modulator driven by an adjustable clock source to modulate a single-frequency reference laser to generate laser sidebands with equal frequency intervals. The tunable laser is locked to the fifth-order sideband through an offset fre-
(Continued)

quency locking technology. After locking, the interval frequency of the sideband is determined by the adjustable clock source, namely dynamic sideband. The frequency of the adjustable clock source is dynamically adjusted, the interval frequency of the sideband and the frequency difference between the two lasers will change accordingly. Combined with the multi-wavelength interferometry, the constructed synthetic wavelength is also determined by the adjustable clock source, that is, the variable synthetic wavelength. The variable synthetic wavelength is dynamically adjusted, and the multi-level second-level synthetic wavelength is continuously constructed from large level to small level.

5 Claims, 2 Drawing Sheets

(51) Int. Cl.
G01B 9/02004 (2022.01)
G01B 11/02 (2006.01)
G02B 27/12 (2006.01)
G02B 27/28 (2006.01)
G02F 1/21 (2006.01)
H01S 5/0687 (2006.01)

(52) U.S. Cl.
CPC ........... *G02B 27/12* (2013.01); *G02B 27/283* (2013.01); *G02F 1/21* (2013.01); *H01S 5/0687* (2013.01); *G02F 2203/50* (2013.01)

(58) Field of Classification Search
USPC .......................................................... 356/3
See application file for complete search history.

(56) References Cited

U.S. PATENT DOCUMENTS

| | | | | |
|---|---|---|---|---|
| 10,247,538 B2* | 4/2019 | Roos | ................... | H04B 10/071 |
| 10,340,658 B1* | 7/2019 | Boyd | ................... | H05H 3/02 |
| 2009/0207418 A1* | 8/2009 | Kim | ................... | G01B 9/02004 |
| | | | | 356/498 |
| 2010/0026983 A1* | 2/2010 | Kawasaki | .......... | G01B 9/02069 |
| | | | | 356/3 |
| 2010/0046003 A1* | 2/2010 | Le Floch | .............. | H01S 5/4068 |
| | | | | 356/486 |
| 2011/0211198 A1* | 9/2011 | Koda | ................. | G01B 9/02027 |
| | | | | 356/499 |
| 2013/0003038 A1* | 1/2013 | Tachizaki | .......... | G01B 9/02008 |
| | | | | 356/5.11 |
| 2013/0088722 A1* | 4/2013 | Yamada | ............. | G01B 9/02005 |
| | | | | 356/489 |
| 2015/0131078 A1* | 5/2015 | Soreide | ................... | G01S 17/36 |
| | | | | 356/4.1 |
| 2015/0331109 A1* | 11/2015 | Christensen | .......... | G01S 7/4808 |
| | | | | 356/458 |

FOREIGN PATENT DOCUMENTS

| | | | | |
|---|---|---|---|---|
| CN | 104635237 | | 5/2015 | |
| CN | 105589074 A | * | 5/2016 | ............. G01S 17/34 |
| CN | 107063080 A | * | 8/2017 | ......... G01B 9/02007 |
| CN | 107764189 A | * | 3/2018 | ............. G01B 11/02 |
| CN | 110174058 | | 8/2019 | |
| CN | 110865382 | | 3/2020 | |

OTHER PUBLICATIONS

"Written Opinion of The International Searching Authority (Form PCT/ISA/237) of PCT/CN2020/107743", mailed on Jan. 28, 2021, pp. 1-4.

* cited by examiner

VARIABLE SYNTHETIC WAVELENGTH ABSOLUTE DISTANCE MEASURING DEVICE LOCKED TO DYNAMIC SIDEBAND AND METHOD THEREOF

CROSS-REFERENCE TO RELATED APPLICATION

This application is a 371 of international application of PCT application serial no. PCT/CN2020/107743, filed on Aug. 7, 2020, which claims the priority benefit of China application no. 202010396830.6, filed on May 12, 2020. The entirety of each of the above mentioned patent applications is hereby incorporated by reference herein and made a part of this specification.

FIELD OF THE DISCLOSURE

The disclosure belongs to the field of laser interferometry, in particular to a variable synthetic wavelength absolute distance measuring device locked to a dynamic sideband and method thereof.

DESCRIPTION OF RELATED ART

Multi-wavelength interferometry based on synthetic wavelength is widely used in the field of absolute distance interferometry due to its advantages such as large non-ambiguity distance and high relative accuracy. The key technology of multi-wavelength interferometry is to construct a synthetic wavelength through multiple different laser wavelengths. The conventional method of using fixed-wavelength lasers (such as helium-neon lasers and iodine frequency-stabilized lasers) requires multiple lasers when multiple wavelengths are required, which makes the system complicated and the construction of synthetic wavelengths will be restricted, making it difficult to realize the transition from large level to small level. The conventional method of using a tunable laser mainly realizes the tuning of the laser wavelength by modulating the current of the laser diode, and then realizes multiple wavelengths. However, the resolution for laser wavelength tuning in the conventional method is not high enough to accurately construct a large synthetic wavelength, and the tuning range is not broad enough to construct a small synthetic wavelength. Moreover, the tuning accuracy is not high enough and the tuning process is highly interfered by ambient temperature, resulting in poor stability in the synthetic wavelength, and the measurement accuracy is difficult to be improved.

In recent years, the multi-wavelength interferometry method that locks a tunable laser to a femtosecond optical frequency comb has improved the frequency tuning accuracy, but the comb interval frequency of the femtosecond optical frequency comb can usually only be fine-tuned on the level of MHz. To obtain lasers of different wavelengths, it is required to lock the tunable laser to different combs. When constructing different synthetic wavelengths, it is required to unlock and then relock the laser to another comb. The magnitude of synthetic wavelength is determined by the number of comb that is skipped during two times of locking. Frequent locking and unlocking imposes extremely high requirements on the offset frequency locking system and is relatively time-consuming, which reduces the measurement efficiency. In addition, limited by the repetition frequency of the optical frequency comb, usually this method can only construct a synthetic wavelength within 3 m, which can hardly satisfy the requirements of measurement of large-scale absolute distance.

Therefore, how to control the laser to accurately tune the frequency and how to continuously construct a multi-level synthetic wavelength from large level to small level are key technical issues that need to be resolved.

SUMMARY OF THE DISCLOSURE

In order to solve the problems in the current technology, the disclosure discloses a variable synthetic wavelength absolute distance measuring device locked to a high-frequency electro-optic phase modulator (EOM) dynamic sideband and a method thereof. The disclosure solves the problem of low frequency tuning accuracy in multi-wavelength interferometry and the difficulty in continuously and accurately constructing a multi-level synthetic wavelength from large level to small level in measurement of absolute distance. The disclosure can be widely used in the field of interferometry.

The technical solutions adopted by the disclosure to solve its technical problems are:

1. A variable synthetic wavelength absolute distance measuring device locked to a dynamic sideband:

The device includes a reference laser, a first optical fiber splitter, a high-frequency electro-optic phase modulator, a quadrature optical fiber combiner, a high-frequency amplifier, an adjustable clock source, an atomic clock, an offset frequency detection and locking controller, a tunable laser, a second optical fiber splitter, an optical fiber combiner and a sinusoidal phase modulation interferometer. The output end of the reference laser is connected to the input end of the first optical fiber splitter. The output ends of the first optical fiber splitter are respectively connected to an input end of the high-frequency electro-optical phase modulator and an input end of the quadrature optical fiber combiner. The output end of the adjustable clock source is connected to the input end of the high-frequency amplifier. The output end of the high-frequency amplifier is connected to the other input end of the high-frequency electro-optical phase modulator. The output end of the high-frequency electro-optical phase modulator is connected to the input end of the optical fiber combiner. The output end of the tunable laser is connected to the input end of the second optical fiber splitter. The output ends of the second optical fiber splitter are respectively connected to the other input end of the optical fiber combiner and the other input end of the quadrature optical fiber combiner. The output end of the optical fiber combiner is connected to the input end of the offset frequency detection and locking controller. The output end of the offset frequency detection and locking controller is connected to the input end of the tunable laser. The output end of the quadrature optical fiber combiner is connected to the input end of the coupler. The output end of the coupler is connected to the sinusoidal phase modulation interferometer. The output end of atomic clock is connected to the input end of the adjustable clock source and the offset frequency detection and locking controller.

The laser emitted by the reference laser is used as the reference laser beam, and is divided into two lasers with a power ratio of 80:20 by the first optical fiber splitter, of which a laser with a power ratio of 20% is input to the high-frequency electro-optic phase modulator for modulation, so as to generate laser sidebands with equal frequency intervals. The frequency interval of the laser sidebands is equal to the clock frequency of the adjustable clock source.

The laser emitted by the tunable laser is divided by the second optical fiber splitter into two lasers with a power ratio of 90:10. A laser with a power ratio of 10% and the laser sidebands generated by the modulation of the high-frequency electro-optic phase modulator jointly enter the optical fiber combiner to combine the light and the combined light is input to the offset frequency detection and locking controller. The offset frequency detection and locking controller generates a feedback control signal to the tunable laser, and locks the laser frequency of the tunable laser to the sideband of the reference laser beam. Another laser of the reference laser beam that is output by the first optical fiber splitter and with a power ratio of 80% as well as another laser of the tunable laser beam that is output by the second optical fiber splitter and with a power ratio of 90% are input to the quadrature optical fiber combiner to combine the light and transmit the combined light to the coupler. The coupler outputs quadrature polarized light to the sinusoidal phase modulation interferometer measurement module.

The sinusoidal phase modulation interferometer includes a reference mirror, a low-frequency electro-optic phase modulator, a beam splitter, a measuring mirror, a polarization beam splitter, a first photodetector, a second photodetector, a second analog-to-digital converter, a first analog-to-digital converter, and a field programmable gate array signal processor. The coupler outputs quadrature polarized light, which is emitted to the sinusoidal phase modulation interferometer measurement module composed of the reference mirror, the low-frequency electro-optic phase modulator, the beam splitter, the measuring mirror, the polarization beam splitter, the first photodetector, the second photodetector, the first analog-to-digital converter, the second analog-to-digital converter and the field programmable gate array signal processor. The low-frequency electro-optic phase modulator is placed in the reference arm between the beam splitter and the reference mirror. The interference signals of the reference laser and the tunable laser are detected by the first photodetector and the second photodetector, and sampled by the first analog-to-digital converter and the second analog-to-digital converter to enter the field programmable gate array signal processor for phase demodulation.

In the laser output by the coupler, the reference laser beam is in the P-polarization state, and the tunable laser beam is in the S-polarization state. The laser is divided into the transmitted measurement light and the reflected reference light after passing through the beam splitter. The measurement light is reflected by the measuring mirror and then returned to the beam splitter in parallel and then reflected, forming the measuring optical path. The reference light is input to the reference mirror after passing through the low-frequency electro-optic phase modulator, and then returned to the beam splitter in parallel and transmitted after being reflected by the reference mirror to form the reference optical path. The measurement light and reference light returned to the beam splitter are combined and divided by the polarization beam splitter into two beams in transmitted P-polarization state and reflected S-polarization state. The beam in the P-polarization state illuminates the first photodetector, and the other beam in the S-polarization state illuminates the second photodetector. The output ends of the first photodetector and the second photodetector are respectively connected to the field programmable array signal processor (FPGA) for data phase demodulation processing through respective first analog-to-digital converter and second analog-to-digital converter.

2. A variable synthetic wavelength absolute distance measuring method locked to a dynamic sideband:

1) a laser output by a single-frequency reference laser is subjected to high-frequency sinusoidal phase modulation by using a high-frequency electro-optic phase modulator to generate laser sidebands with equal frequency intervals, which are expressed as follows:

$$f_{EOM}=f_1+k\cdot f_r$$

In the expression, $f_1$ represents the laser frequency of the reference laser, $f_r$ represents the modulation frequency of the high-frequency electro-optic phase modulator, k represents the order of the laser sideband generated by the modulation, $k=0, \pm 1, \pm 2, \ldots$.

2) The laser output by the tunable laser and the laser sideband of the reference laser that is output after being modulated by the high-frequency electro-optic phase modulator are combined by the optical fiber combiner to generate the beat frequency. The tunable laser is locked to the Nth order of laser sideband through the offset frequency detection and locking controller. In specific implementation, the order number N=5, the frequency relationship between tunable laser and reference laser is expressed as follows:

$$f_2=f_1+f_b$$

$$f_b=Nf_r+f_o$$

In the expression, $f_2$ represents the laser frequency of the tunable laser, $f_b$ represents the frequency difference between the tunable laser and the reference laser, and $f_o$ represents the lock offset frequency of the tunable laser and the N-th sideband. In the specific implementation, $f_o=20$ MHz.

The modulation frequency $f_r$ of the high-frequency electro-optic phase modulator is dynamically adjusted in frequency to generate a sideband with variable interval frequency, namely the dynamic sideband, followed by M times of frequency dynamic adjustments, and i represents the serial number for the times (i=1,2,3, . . . , M) of the frequency dynamic adjustment. The modulation frequency of the high-frequency electro-optic phase modulator after each dynamic adjustment is marked as $f_{r[i]}$, wherein $f_{r[0]}$ represents the initial frequency. The frequency difference between the tunable laser and the reference laser in the i-th frequency dynamic adjustment is calculated as follows:

$$f_{b[i]}=Nf_{r[i]}+f_o$$

In the expression, $f_{b[i]}$ represents the dynamic frequency difference between the tunable laser and the reference laser during the i-th frequency dynamic adjustment.

The frequency of tunable laser is calculated as follows:

$$f_{2[i]}=f_1+f_{b[i]}=f_1=Nf_{r[i]}+f_o$$

In the expression, $f_{2[i]}$ represents the dynamic frequency of the tunable laser during the i-th frequency dynamic adjustment.

Under the closed-loop control of offset frequency detection and locking controller, when the high-frequency electro-optic phase modulator modulation frequency is dynamically adjusted, the tunable laser still remains locked with the Nth-order of sideband of the reference laser. When the frequency $f_{r[i]}$ of dynamic sideband is dynamically adjusted, the laser frequency of the tunable laser is adjusted synchronously and the adjustment amount is enlarged by N times.

3) The quadrature optical fiber combiner is used to combine the reference laser and the tunable laser into a quadrature polarized light, which is incident on the sinusoidal phase modulation interferometer measurement module for measurement of absolute distance to construct a synthetic wavelength $\lambda_{S[i]}$, the formula is as follows:

$$\lambda_{s[i]} = \left| \frac{\lambda_1 \cdot \lambda_{2[i]}}{\lambda_1 - \lambda_{2[i]}} \right| = \frac{c}{f_{b[i]}} = \frac{c}{Nf_{r[i]} + f_o}$$

$$\lambda_{2[i]} = c/f_{2[i]}, \lambda_1 = c/f_1$$

In the formula, $\lambda_1$ is the laser wavelength of the reference laser, $\lambda_{2[i]}$ is the laser wavelength of the tunable laser after the i-th adjustment for the modulation frequency of the high-frequency electro-optic phase modulator, and c is the speed of light in vacuum.

The magnitude of the synthetic wavelength is determined by the modulation frequency $f_{r[i]}$ of the high-frequency electro-optic phase modulator. Every time after the modulation frequency $f_{r[i]}$ of the high-frequency electro-optic phase modulator is dynamically adjusted, the i-th synthetic wavelength and the i−1th synthetic wavelength are used to construct the second-level synthetic wavelength $\lambda_{SS[i]}$, the formula is as follows:

$$\lambda_{ss[i]} = \left| \frac{\lambda_{s[i]} \cdot \lambda_{s[i-1]}}{\lambda_{s[i]} - \lambda_{s[i-1]}} \right| = \frac{c}{N\Delta f_{r[i]}}$$

$$\Delta f_{r[i]} = f_{r[i]} - f_{r[i-1]}$$

In the expression, $\Delta f_{r[i]}$ represents the i-th frequency dynamic adjustment increment of the high-frequency electro-optic phase modulator, $\Delta f_{r[i]} > 0$.

The magnitude of the second-level synthetic wavelength is determined by $\Delta f_{r[i]}$, that is, the synthetic wavelength is variable. Moreover, the smaller the frequency dynamic adjustment increment is, the larger the second-level synthetic wavelength is. Conversely, the larger the frequency dynamic adjustment increment is, the smaller the second-level synthetic wavelength is. Furthermore, by controlling the frequency dynamic adjustment increment, a second-level synthetic wavelength ranging from km-level to mm-level can be constructed continuously.

In addition, the frequency dynamic adjustment increment $\Delta f_{r[i]}$ of the dynamic sideband can be traced back to the atomic clock, which ensures the stability and traceability of the constructed second-level synthetic wavelength.

4) In the sinusoidal phase modulation interferometer measurement module, the interference signals of the reference laser and the tunable laser are detected by two photodetectors respectively, and then sampled by the analog-to-digital converter, and then enter the field programmable gate array signal processor for phase demodulation. The phases of two interference signals are obtained, and the phase of the synthetic wavelength (that is, the phase difference between the two interference signals) and the phase of the second-level synthetic wavelength are calculated as follows:

$$\varphi_{s[i]} = \varphi_{2[i]} - \varphi_1 = \frac{4\pi}{\lambda_{s[i]}} L$$

$$\varphi_{ss[i]} = \varphi_{s[i-1]} - \varphi_{s[i]} = \frac{4\pi}{\lambda_{ss[i]}} L$$

In the expression, L represents the distance to be measured of the measuring mirror in the sinusoidal phase modulation interferometer, $\varphi_1$ represents the phase of the interference signal of the reference laser, $\varphi_{2[i]}$, $\varphi_{s[i]}$ and $\varphi_{SS[i]}$ respectively indicate the phase of interference signal of the tunable laser after i-th adjustment for the modulation frequency of the high-frequency electro-optic phase modulator, the phase of synthetic wavelength and the phase of second-level synthetic wavelength.

5) After the modulation frequency of the high-frequency electro-optic phase modulator is dynamically adjusted for the i=1 time, the initial measurement result of the corresponding absolute distance is obtained according to the second-level synthetic wavelength and the corresponding phase. The formula is as follows:

$$L_1 = \lambda_{ss[1]} \cdot \frac{\varphi_{ss[1]}}{4\pi}$$

After the i-th dynamic adjustment is performed for the modulation frequency of high-frequency electro-optic phase modulator, i>1, according to the synthetic wavelength transition theory, the measurement results of absolute distance are expressed as follows:

$$L_i = \left( \text{int}\left[ \frac{2L_{i-1}}{\lambda_{ss[i]}} - \frac{\varphi_{ss[i]}}{2\pi} \right] + \frac{\varphi_{ss[i]}}{2\pi} \right) \bullet \frac{\lambda_{ss[i]}}{2}, i = 2, 3 \dots M$$

In the expression, int[ ] means rounding up.

6) Steps 3), 4), and 5) are repeated for a total of M times, and M times of frequency dynamic adjustments are completed, and finally the measurement result is obtained as final absolute distance $L_M$.

The combined expression formula of the above-mentioned ranging result is as follows:

$$L_i = \begin{cases} L_1 = \lambda_{ss[1]} \cdot \frac{\varphi_{ss[i]}}{4\pi}, & i = 1 \\ \left( \text{int}\left[ \frac{2L_{i-1}}{\lambda_{ss[i]}} - \frac{\varphi_{ss[i]}}{2\pi} \right] + \frac{\varphi_{ss[i]}}{2\pi} \right) \bullet \frac{\lambda_{ss[i]}}{2}, & i = 2, 3 \dots M \end{cases}$$

In the measurement process of the disclosure, the second-level synthetic wavelength is continuously reduced, and the measurement accuracy is continuously improved. Finally, a measurement of large-scale absolute distance with an accuracy of ten micrometers within a kilometer-level measurement range is realized.

Compared with the conventional technology, the disclosure has the following advantageous effects.

(1) The variable synthetic wavelength construction method locked to the high-frequency EOM dynamic sideband of the disclosure makes a clever use of the dynamic sideband to achieve the effect of "frequency amplification", and is able to continuously construct a multi-level second-level synthetic wavelength (kilometers to millimeters) from large level to small level, thereby solving the difficulty of continuously and accurately constructing a multi-level synthetic wavelength from large level to small level in measurement of large-scale absolute distance.

(2) The second-level synthetic wavelength constructed by the disclosure is directly traceable to the atomic clock, the frequency stability is high and measurement accuracy is improved.

(3) In the process of constructing the variable synthetic wavelength of the disclosure, the tunable laser is always kept in a locked state, and there is no need to switch between locking and unlocking, which saves the time required for frequency switching and improves the measurement efficiency and stability.

In summary, the disclosure solves the problem of low frequency tuning accuracy in the multi-wavelength interference absolute distance measurement method, and the difficulty of continuously and accurately constructing a multi-level synthetic wavelength from large level to small level, and can be widely used in the field of interferometry measurement.

1, reference laser; 2, first optical fiber splitter; 3, high-frequency electro-optic phase modulator (EOM); 4, quadrature optical fiber combiner; 5, coupler; 6, reference mirror; 7, low-frequency electro-optic phase modulator (EOM); 8, beam splitter; 9, measuring mirror; 10, high-frequency amplifier; 11, adjustable clock source; 12, atomic clock; 13, offset frequency detection and locking controller; 14, tunable laser; 15, second optical fiber splitter; 16, optical fiber combiner; 17, polarization beam splitter; 18, first photodetector; 19, second photodetector; 20, second analog-to-digital converter; 21, first analog-to-digital converter; 22, field programmable gate array signal processor (FPGA).

DESCRIPTION OF EMBODIMENTS

The disclosure will now be described in further detail with reference to the accompanying drawings and embodiments.

Figure 2:
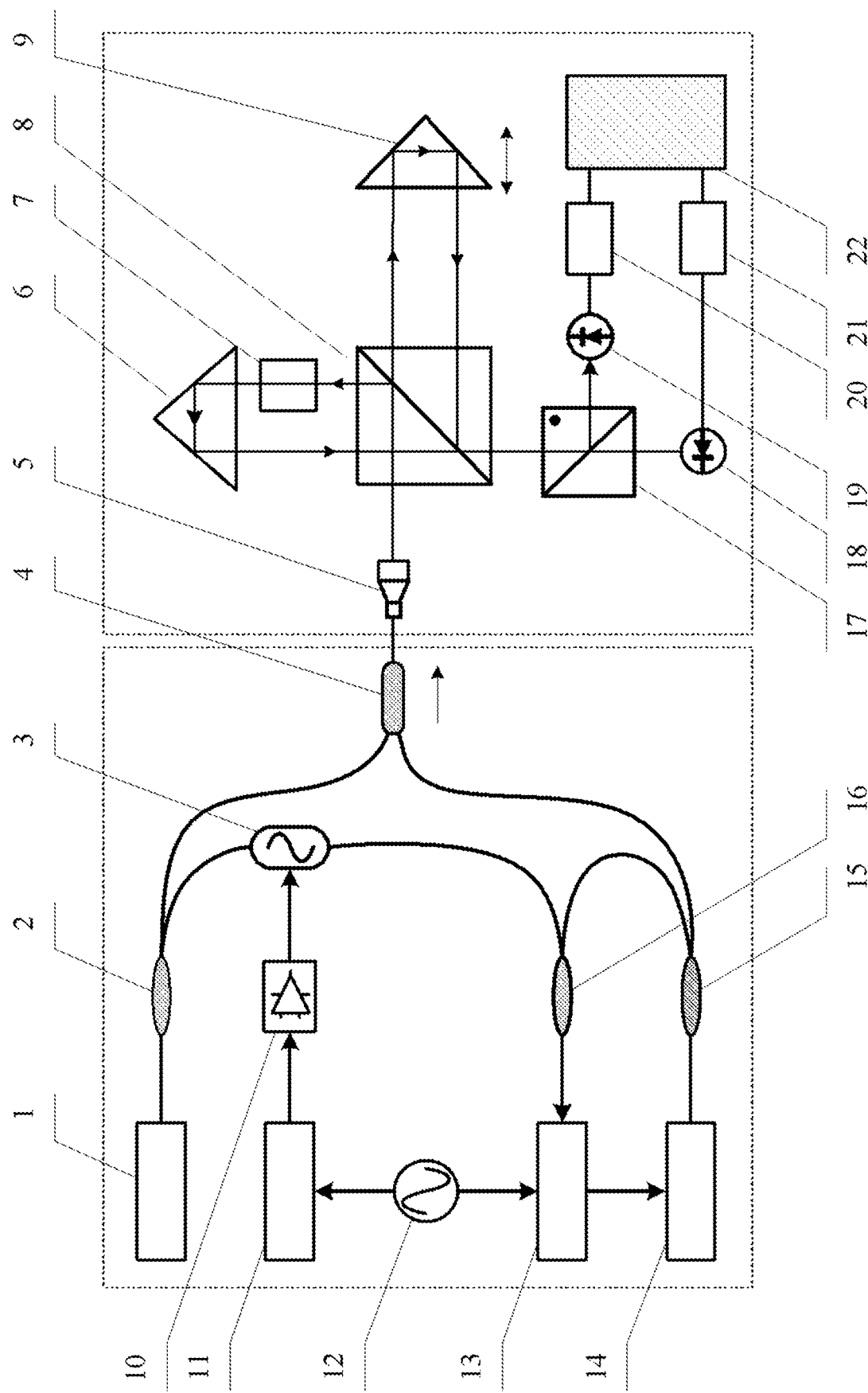
FIG. 2 is a schematic block diagram of the variable synthetic wavelength absolute distance measuring device locked to the dynamic sideband and a method thereof.

As shown in FIG. 2, the device implemented in the disclosure includes a reference laser 1, a first optical fiber splitter 2, a high-frequency electro-optic phase modulator 3, a quadrature optical fiber combiner 4, a high-frequency amplifier 10, an adjustable clock source 11, an atomic clock 12, an offset frequency detection and locking controller 13, a tunable laser 14, a second optical fiber splitter 15, an optical fiber combiner 16 and a sinusoidal phase modulation interferometer.

The output end of the reference laser 1 is connected to the input end of first optical fiber splitter 2. The output ends of the first optical fiber splitter 2 are connected to an input end of the high-frequency electro-optic phase modulator 3 and an input end of the quadrature optical fiber combiner 4. The output end of the adjustable clock source 11 is connected to the input end of the high-frequency amplifier 10. The output end of the high-frequency amplifier 10 is connected to the other input end of the high-frequency electro-optic phase modulator 3. The output end of the high-frequency electro-optic phase modulator 3 is connected to the input end of the optical fiber combiner 16. The output end of the tunable laser 14 is connected to the input end of the second optical fiber splitter 15. The output ends of the second optical fiber splitter 15 are connected to the other input end of the optical fiber combiner 16 and the other input end of the quadrature optical fiber combiner 4. The output end of the optical fiber combiner 16 is connected to the input end of the offset frequency detection and locking controller 13. The output end of the offset frequency detection and locking controller 13 is connected to the input end of the tunable laser 14. The output end of the quadrature optical fiber combiner 4 is connected to the input end of the coupler 5. The coupler 5 is output to the sinusoidal phase modulation interferometer. The output end of the atomic clock 12 is connected to the input end of the adjustable clock source 11 and the offset frequency detection and locking controller 13.

The laser emitted by the reference laser 1 is used as the reference laser beam, and is divided into two lasers with a power ratio of 80:20 by the first optical fiber splitter 2, of which a laser with a power ratio of 20% is input to the high-frequency electro-optic phase modulator 3 for modulation, so as to generate laser sidebands with equal frequency intervals. The frequency interval of the laser sidebands is equal to the clock frequency of the adjustable clock source 11. The laser emitted by the tunable laser 14 is divided by the second optical fiber splitter 15 into two lasers with a power ratio of 90:10. A laser with a power ratio of 10% and the laser sidebands generated by modulation carried out by the high-frequency electro-optic phase modulator 3 jointly enter the optical fiber combiner 16 to combine the light and input to the offset frequency detection and locking controller 13. The offset frequency detection and locking controller 13 generates a feedback control signal to the tunable laser 14, and lock the laser frequency of the tunable laser 14 to the specific sideband of the reference laser beam. Another laser of the reference laser beam that is output by the first optical fiber splitter 2 and with a power ratio of 80% as well as another laser of the tunable laser 14 that is output by the second optical fiber splitter 15 and with a power ratio of 90% are input to the quadrature optical fiber combiner 4 to combine the light and transmit the combined light to the coupler 5. The coupler 5 outputs quadrature polarized light to the sinusoidal phase modulation interferometer measurement module.

The sinusoidal phase modulation interferometer includes a reference mirror 6, a low-frequency electro-optic phase modulator 7, a beam splitter 8, a measuring mirror 9, a polarization beam splitter 17, a first photodetector 18, a second photodetector 19, a second analog-to-digital converter 20, a first analog-to-digital converter 21 and a field programmable gate array signal processor 22. The coupler 5 outputs quadrature polarized light, which is emitted to the sinusoidal phase modulation interferometer measurement module composed of the reference mirror 6, the low-frequency electro-optic phase modulator 7, the beam splitter 8, the measuring mirror 9, the polarization beam splitter 17, the first photodetector 18, the second photodetector 19, the first analog-to-digital converter 21, the second analog-to-digital converter 20 and the field programmable gate array signal processor 22. The low-frequency electro-optic phase modulator 7 is placed in the reference arm between the beam splitter 8 and the reference mirror 6. The interference signals of the reference laser 1 and the tunable laser 14 are detected by the first photodetector 18 and the second photodetector 19, and sampled by the first analog-to-digital converter 21 and the second analog-to-digital converter 20 to enter the field programmable gate array signal processor 22 for phase demodulation. Specifically, the sinusoidal phase modulation interferometer measurement module includes a beam splitter, a reference mirror, a low frequency EOM, a measuring mirror, a polarization beam splitter, a first photodetector, a second photodetector, a first analog-to-digital converter, a second analog-to-digital converter and a field programmable gate array signal processor (FPGA).

In the laser output by the coupler 5, the reference laser beam is in the P-polarization state, and the tunable laser beam is in the S-polarization state. The laser is divided into the transmitted measurement light and the reflected reference light after passing through the beam splitter 8. The reference laser beam is reflected, and the tunable laser beam is transmitted. The measurement light is reflected by the measuring mirror 9 and then returned to the beam splitter in parallel and then reflected, forming the measuring optical path. The reference light is input to the reference mirror 6 after passing through the low-frequency electro-optic phase modulator 7, and then returned to the beam splitter 8 in parallel and transmitted after being reflected by the reference mirror 6 to form the reference optical path. The measurement light and reference light returned to the beam splitter 8 are combined after being reflected and transmitted through the beam splitter 8 and divided by the polarization beam splitter 17 into two beams in transmitted P-polarization state and reflected S-polarization state. The beam in the P-polarization state illuminates the first photodetector 18, and the other beam in the S-polarization state illuminates the second photodetector 19. The output ends of the first photodetector 18 and the second photodetector 19 are respectively connected to the field programmable array signal processor (FPGA) for data phase demodulation processing through respective first analog-to-digital converter 21 and second analog-to-digital converter 20.

In specific implementation, the atomic clock provides a reference clock with a frequency of 10 MHz for the adjustable clock source and offset frequency detection and locking controller.

The implementation process is as follows:

The atomic clock 12 provides a reference clock with a frequency of 10 MHz for the adjustable clock source 11 and the offset frequency detection and locking controller 13. The laser emitted by the reference laser 1 is divided into two lasers with a power ratio of 80:20 by the first optical fiber splitter 2. The laser with a power ratio of 20% is input to the high-frequency electro-optic phase modulator 3 for modulation to generate laser sidebands with equal frequency intervals. The frequency interval of the laser sidebands is equal to the clock frequency of the adjustable clock source 11; the frequency of the laser sidebands can be expressed as follows:

$$f_{EOM} = f_1 + k \cdot f_r \quad (1)$$

In the expression, $f_1$ represents the laser frequency of the reference laser 1, $f_r = 12$ GHz represents the modulation frequency (that is, the frequency of adjustable clock source) of the high-frequency electro-optic phase modulator 3, k represents the order of the laser sideband generated by the modulation (k=0, ±1, ±2, ...)

The laser emitted by the tunable laser 14 is divided by the second optical fiber splitter 15 into two lasers with a power ratio of 90:10. A laser output by the second optical fiber splitter 15 and with a power ratio of 10% as well as the laser sidebands generated by modulation carried out by the high-frequency electro-optic phase modulator 3 jointly enter the optical fiber combiner 16 to combine the light and input to the offset frequency detection and locking controller 13. The offset frequency detection and locking controller 13 generates a feedback control signal to the tunable laser 14, and lock the laser frequency of the tunable laser 14 to the N-th order of sideband (N=5) of the reference laser 1. The frequency relationship between the two lasers can be expressed as follows.

$$f_2 = f_1 + f_b \quad (2)$$

In the expression, $f_2$ represents the laser frequency of the tunable laser 14, and $f_b$ is the frequency difference between the tunable laser 14 and the reference laser 1. The formula is as follows:

$$f_b = N f_r + f_o \quad (3)$$

In the formula, $f_o = 20$ MHz represents the locked offset frequency of the tunable laser 14 and the Nth sideband.

The output frequency $f_r$ of the adjustable clock source 11 is changed to dynamically adjust the modulation frequency of the high-frequency electro-optic phase modulator, so as to generate a sideband with variable interval frequency, namely the dynamic sideband. A total of M times of frequency dynamic adjustments are carried out, and i represents the serial number for the times (i=1,2,3, ..., M) of the frequency dynamic adjustment. The frequency of the adjustable clock source 11 after each dynamic adjustment is marked as $f_{r[i]}$, wherein $f_{r[0]}$ represents the initial frequency. The dynamic frequency difference $f_{b[i]}$ between the tunable laser 14 and the reference laser 1 in the i-th frequency dynamic adjustment is expressed as follows:

$$f_{b[i]} = N f_{r[i]} + f_o \quad (4)$$

Then the dynamic frequency $f_{2[i]}$ of the tunable laser 14 is expressed as follows:

$$f_{2[i]} = f_1 + f_{b[i]} = f_1 = N f_{r[i]} + f_o \quad (5)$$

Figure 1:
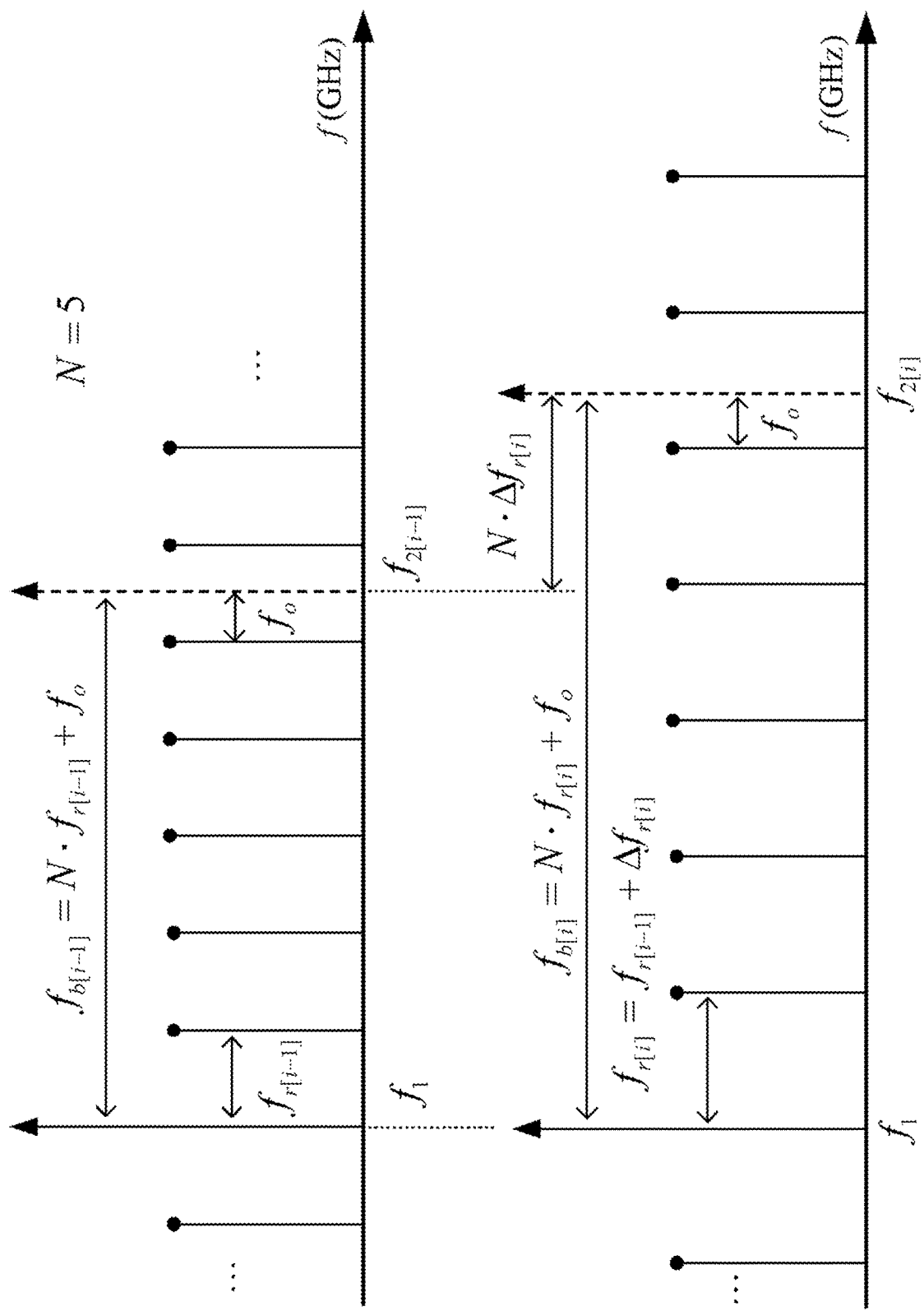
FIG. 1 is a schematic diagram of the laser frequency relationship when the tunable laser is locked to the dynamic sideband of the reference laser.

FIG. 1 shows the schematic diagram of the laser frequency relationship when the tunable laser is locked to the dynamic sideband of the reference laser before and after the i-th dynamic adjustment, which is a further description of formula (5). Under the closed-loop control of offset frequency detection and locking controller 13, the adjustable clock source 11 is controlled to dynamically adjust the modulation frequency of the high-frequency electro-optic phase modulator 3. The tunable laser 14 will remain locked to the Nth-order of sideband of the reference laser 1, forming a frequency transmission chain and establishing the relationship between the laser frequency difference $f_{r[i]}$ and the adjustable clock source 11 (radio frequency microwave frequency) as well as tracing back to the atomic clock 12, that is, formula (5) is constantly established. Therefore, when the interval frequency $f_{r[i]}$ of dynamic sideband is dynamically adjusted, the laser frequency of the tunable laser 14 is adjusted synchronously and the adjustment amount is enlarged by N times (N=5), that is, the frequency can be amplified by locking to the dynamic sideband. Theoretically, the larger the locked level, the stronger the frequency amplification effect. The quadrature optical fiber combiner 4 is used to combine the reference laser 1 and the tunable laser 14 into a quadrature light beam, which is incident on the sinusoidal phase modulation interferometer measurement module for absolute distance measurement, and the synthetic wavelength is constructed. The formula is as follows:

$$\lambda_{s[i]} = \left| \frac{\lambda_1 \cdot \lambda_{2[i]}}{\lambda_1 - \lambda_{2[i]}} \right| = \frac{c}{f_{b[i]}} = \frac{c}{N f_{r[i]} + f_o} \quad (6)$$

In the formula, $\lambda_1 = c/f_1$ is the laser wavelength of the reference laser 1, $\lambda_{2[i]} = c/f_{2[i]}$ is the tunable laser 14 after the i-th adjustment for the modulation frequency of the high-frequency electro-optic phase modulator, and c is the speed of light in vacuum. Obviously, the magnitude of synthetic wavelength is determined by the frequency $f_{r[i]}$ of the adjustable clock source 11. Each time the frequency of the adjustable clock source 11 is dynamically adjusted, the i-th synthetic wavelength $\lambda_{2[i]}$ and the i−1th synthetic wavelength $\lambda_{2[i-1]}$ are used to construct the second-level synthetic wavelength, and the formula is as follows:

$$\lambda_{ss[i]} = \left| \frac{\lambda_{s[i]} \cdot \lambda_{s[i-1]}}{\lambda_{s[i]} - \lambda_{s[i-1]}} \right| = \frac{c}{N \Delta f_{r[i]}} \quad (7)$$

In the expression, $\Delta f_{r[i]} = f_{r[i]} - f_{r[i-1]}$ represents the i-th frequency dynamic adjustment increment ($\Delta f_{r[i]} > 0$) of the adjustable clock source 11. That is to say, the magnitude of the second-level synthetic wavelength is determined by the frequency dynamic adjustment increment of the adjustable clock source 11, that is, the synthetic wavelength is variable. Moreover, the smaller the frequency dynamic adjustment increment is, the larger the second-level synthetic wavelength is. Conversely, the larger the frequency dynamic adjustment increment is, the smaller the second-level synthetic wavelength is. Furthermore, by controlling the frequency increment, a second-level synthetic wavelength ranging from km-level to mm-level can be constructed continuously. In addition, the frequency dynamic adjustment increment $\Delta f_{r[i]}$ of the dynamic sideband can be traced back to the atomic clock 12, which ensures the stability and traceability of the constructed second-level synthetic wavelength.

In the sinusoidal phase modulation interferometer measurement module, the phases of two interference signals are obtained through demodulation of the field programmable gate array signal processor 22, and respectively expressed as follows:

$$\varphi_1 = \frac{4\pi}{\lambda_1} L \quad (8)$$

$$\varphi_2 = \frac{4\pi}{\lambda_{2[i]}} L \quad (9)$$

In the expression, L represents the distance to be measured of the measuring mirror, $\varphi_1$ represents the phase of the interference signal of the reference laser, $\varphi_{2[i]}$ indicates the phase of interference signal of the tunable laser after i-th adjustment for the modulation frequency of the high-frequency electro-optic phase modulator; then the phase of synthetic wavelength ($\lambda_{S[i]}$) can be expressed as follows:

$$\varphi_{s[i]} = \varphi_2 - \varphi_1 = \frac{4\pi}{\lambda_{s[i]}} L \quad (10)$$

Then the phase of the second-level synthetic wavelength can be expressed as follows:

$$\varphi_{ss[i]} = \varphi_{s[i-1]} - \varphi_{s[i]} = \frac{4\pi}{\lambda_{ss[i]}} L \quad (11)$$

After the frequency of the adjustable clock source 11 is adjusted dynamically for the first time (i=1), the initial measurement result of the corresponding absolute distance measurement can be obtained according to the second-level synthetic wavelength and the corresponding phase. The formula is as follows:

$$L_1 = \lambda_{ss[1]} \cdot \frac{\varphi_{ss[1]}}{4\pi} \quad (12)$$

After the frequency of the adjustable clock source 11 is dynamically adjusted for the i-th time (i>1), according to the synthetic wavelength transition theory, the ranging result can be expressed as follows:

$$L_i = \left( \text{int}\left[ \frac{2L_{i-1}}{\lambda_{ss[i]}} - \frac{\varphi_{ss[i]}}{2\pi} \right] + \frac{\varphi_{ss[i]}}{2\pi} \right) \bullet \frac{\lambda_{ss[i]}}{2}, \, i = 2, 3 \ldots M \quad (13)$$

In the expression, int[ ] means rounding up; steps (3), (4), (5) are repeated for a total of M times (M=5), and the final measurement result is $L_M$; formula (12) and formula (13) can be combined and expressed as follows:

$$L_i = \begin{cases} \lambda_{ss[1]} \cdot \frac{\varphi_{ss[1]}}{4\pi}, & i = 1 \\ \left( \text{int}\left[ \frac{2L_{i-1}}{\lambda_{ss[i]}} - \frac{\varphi_{ss[i]}}{2\pi} \right] + \frac{\varphi_{ss[i]}}{2\pi} \right) \bullet \frac{\lambda_{ss[i]}}{2}, & i = 2, 3 \ldots M \end{cases} \quad (14)$$

Table 1 shows each frequency increment of the adjustable clock source 11 and the corresponding second-level synthetic wavelength and prediction accuracy. Obviously, the second-level synthetic wavelength is up to 2400 m (i=1), which can satisfy the requirement of measurement of large-scale absolute distance within the range of 1200 m. During the transition of the second-level synthetic wavelength (i=2, 3, . . . , M), the absolute measurement range (equal to $\lambda_{S[i]}/2$) is continuously reduced each time, and the measurement accuracy is continuously improved, finally achieving measurement of large-scale absolute distance with micron-level accuracy in the measurement range at kilometer-level. Assuming that the relative phase discrimination accuracy is 0.50%, the final measurement accuracy (or resolution) is about 30.00 μm, and the corresponding relative accuracy is about $2.5 \times 10^{-8}$.

TABLE 1

Inter-level transition and measurement accuracy

| Number (i) | Frequency increment of adjustable clock source | Second-level synthetic wavelength $\lambda_{ss[i]}$ | Measurement range $\lambda_{ss[i]}/2$ | Prediction accuracy |
|---|---|---|---|---|
| 1 | 0.025 MHz | 2400.00 m | 1200.00 m | 6.00 m |
| 2 | 0.500 MHz | 120.00 m | 60.00 m | 0.300 m |
| 3 | 10.000 MHz | 6.00 m | 3.00 m | 15.00 mm |
| 4 | 200.000 MHz | 300.00 m | 150.00 mm | 0.75 mm |
| 5 | 5000.000 MHz | 12.00 mm | 6.00 mm | 30.00 μm |

In summary, the variable synthetic wavelength technology implemented by the disclosure based on the dynamic sideband technology can continuously construct a multi-level second-level synthetic wavelength (in the level of kilometers to millimeters) from large level to small level, thereby solving the difficulty of accurately and continuously constructing multi-level synthetic wavelength from large level to small level in the measurement of absolute distance. Moreover, the measurement lasers are locked to the femtosecond optical frequency comb, and the constructed second-level synthetic wavelength can be directly traced back to the atomic clock; the frequency stability is high and the measurement accuracy is improved. In addition, in the process of generating variable synthetic wavelength, the laser always remains locked, and there is no need to switch between locking and unlocking, which saves the time required or frequency switching and improves measurement efficiency and stability.

The above-mentioned specific embodiments are used to explain the disclosure, not to limit the disclosure. Any modification and change made to the disclosure within the spirit of the disclosure and the protection scope of the claims shall fall into the protection scope of the disclosure.

What is claimed is:

1. A variable synthetic wavelength absolute distance measuring device locked to a dynamic sideband, comprising:
a reference laser, a first optical fiber splitter, a high-frequency electro-optic phase modulator, a quadrature optical fiber combiner, a high-frequency amplifier, an adjustable clock source, an atomic clock, an offset frequency detection and locking controller, a tunable laser, a second optical fiber splitter, an optical fiber combiner and a sinusoidal phase modulation interferometer measurement module;
wherein an output end of the reference laser is connected to an input end of the first optical fiber splitter, output ends of the first optical fiber splitter are connected to an input end of the high-frequency electro-optic phase modulator and an input end of the quadrature optical fiber combiner;
an output end of the adjustable clock source is connected to an input end of the high-frequency amplifier, and an output end of the high-frequency amplifier is connected to another input end of the high-frequency electro-optic phase modulator, an output end of the high-frequency electro-optic phase modulator is connected to an input end of the optical fiber combiner;
an output end of the tunable laser is connected to an input end of the second optical fiber splitter, output ends of the second optical fiber splitter are connected to another input end of the optical fiber combiner and another input end of the quadrature optical fiber combiner;
an output end of the optical fiber combiner is connected to an input end of the offset frequency detection and locking controller, an output end of the offset frequency detection and locking controller is connected to an input end of the tunable laser;
an output end of the quadrature optical fiber combiner is connected to an input end of a coupler;
the coupler is output to the sinusoidal phase modulation interferometer measurement module, an output end of the atomic clock is connected to an input end of the adjustable clock source and the offset frequency detection and locking controller.

2. The variable synthetic wavelength absolute distance measuring device locked to the dynamic sideband according to claim 1, wherein a laser emitted by the reference laser is used as a reference laser beam, and is divided into two lasers with a power ratio of 80:20 by the first optical fiber splitter, of which a laser with a power ratio of 20% is input to the high-frequency electro-optic phase modulator for modulation, so as to generate laser sidebands with equal frequency intervals, the frequency interval of the laser sideband is equal to a clock frequency of the adjustable clock source;
a laser emitted by the tunable laser is divided by the second optical fiber splitter into two lasers with a power ratio of 90:10, of which a laser with a power ratio of 10% and the laser sidebands generated by the modulation of the high-frequency electro-optic phase modulator jointly enter the optical fiber combiner to combine light and the combined light is input to the offset frequency detection and locking controller, the offset frequency detection and locking controller generates a feedback control signal to the tunable laser, and locks a laser frequency of the tunable laser to a sideband of the reference laser beam;
another laser of the reference laser beam that is output by the first optical fiber splitter with a power ratio of 80% as well as another laser of a tunable laser beam that is output by the second optical fiber splitter with a power ratio of 90% are input to the quadrature optical fiber combiner to combine light and transmit a combined light to the coupler, the coupler outputs a quadrature polarized light to the sinusoidal phase modulation interferometer measurement module.

3. The variable synthetic wavelength absolute distance measuring device locked to the dynamic sideband according to claim 1, wherein the sinusoidal phase modulation interferometer measurement module comprises a reference mirror, a low-frequency electro-optic phase modulator, a beam splitter, a measuring mirror, a polarization beam splitter, a first photodetector, a second photodetector, a first analog-to-digital converter, a second analog-to-digital converter, and a field programmable gate array signal processor;
the coupler outputs a quadrature polarized light, which is emitted to the sinusoidal phase modulation interferometer measurement module composed of the reference mirror, the low-frequency electro-optic phase modulator, the beam splitter, the measuring mirror, the polarization beam splitter, the first photodetector, the second photodetector, the first analog-to-digital converter, the second analog-to-digital converter and the field programmable gate array signal processor;
the low-frequency electro-optic phase modulator is placed in a reference arm between the beam splitter and the reference mirror;
interference signals of the reference laser and the tunable laser are detected by the first photodetector and the second photodetector, and sampled by the first analog-to-digital converter and the second analog-to-digital converter to enter the field programmable gate array signal processor for phase demodulation.

4. The variable synthetic wavelength absolute distance measuring device locked to the dynamic sideband according to claim 3, wherein in the quadrature polarized light output by the coupler, a reference laser beam is in a P-polarization state, and a tunable laser beam is in a S-polarization state;
the quadrature polarized light is divided into a transmitted measurement light and a reflected reference light after passing through the beam splitter, the measurement light is reflected by the measuring mirror and then returned to the beam splitter in parallel and then reflected, forming a measuring optical path;
the reference light is input to the reference mirror after passing through the low-frequency electro-optic phase modulator, and then returned to the beam splitter in parallel and transmitted after being reflected by the reference mirror to form a reference optical path;
the measurement light and the reference light returned to the beam splitter are combined and divided by the polarization beam splitter into two beams respectively in transmitted P-polarization state and in reflected S-polarization state, the beam in the P-polarization state illuminates the first photodetector, and the beam in the S-polarization state illuminates the second photodetector;

output ends of the first photodetector and the second photodetector are respectively connected to the field programmable array signal processor for data phase demodulation processing through the respective first analog-to-digital converter and the second analog-to-digital converter.

5. A variable synthetic wavelength absolute distance measuring method locked to a dynamic sideband using the device claimed in claim 1, the method comprising following steps:

step 1, a laser output by the reference laser of single-frequency is subjected to high-frequency sinusoidal phase modulation by using the high-frequency electro-optic phase modulator to generate laser sidebands with equal frequency intervals, which are expressed as follows:

$$f_{EOM} = f_1 + k \cdot f_r$$

wherein, $f_1$ represents a laser frequency of the reference laser, $f_r$ represents a modulation frequency of the high-frequency electro-optic phase modulator, k represents an order of the laser sidebands generated by the modulation, k=0, ±1, ±2, . . . ;

step 2, a laser output by the tunable laser and the laser sidebands of the reference laser that is output after being modulated by the high-frequency electro-optic phase modulator are combined by the optical fiber combiner to generate beat frequency, the tunable laser is locked to Nth order of the laser sidebands through the offset frequency detection and locking controller, a frequency relationship between the tunable laser and the reference laser is expressed as follows:

$$f_2 = f_1 + f_b$$

$$f_b = Nf_r + f_o$$

wherein, $f_2$ represents the laser frequency of the tunable laser, $f_b$ represents a frequency difference between the tunable laser and the reference laser, and $f_o$ represents a lock offset frequency of the tunable laser and the N-th sideband;

the modulation frequency $f_r$ of the high-frequency electro-optic phase modulator is dynamically adjusted in frequency to generate a sideband with variable interval frequency, namely a dynamic sideband, followed by M times of frequency dynamic adjustments, and i represents a serial number for the times of the frequency dynamic adjustment, i=1,2,3, . . . , M, the modulation frequency of the high-frequency electro-optic phase modulator after each dynamic adjustment is marked as $f_{r[i]}$, wherein $f_{r[0]}$ represents an initial frequency; a frequency difference between the tunable laser and the reference laser in the i-th frequency dynamic adjustment is calculated as follows:

$$f_{b[i]} = Nf_{r[i]} + f_o$$

wherein, $f_{b[i]}$ represents the dynamic frequency difference between the tunable laser and the reference laser during the i-th frequency dynamic adjustment;

a dynamic frequency of the tunable laser during the i-th frequency dynamic adjustment is calculated as follows:

$$f_{2[i]} = f_1 + f_{b[i]} = f_1 + Nf_{r[i]} + f_o$$

wherein, $f_{2[i]}$ represents the dynamic frequency of the tunable laser during the i-th frequency dynamic adjustment;

step 3, the quadrature optical fiber combiner is used to combine the reference laser and the tunable laser into a quadrature polarized light, which is incident on the sinusoidal phase modulation interferometer measurement module for measurement of absolute distance to construct a synthetic wavelength $\lambda_{s[i]}$, formula is as follows:

$$\lambda_{s[i]} = \left| \frac{\lambda_1 \cdot \lambda_{2[i]}}{\lambda_1 - \lambda_{2[i]}} \right| = \frac{c}{f_{b[i]}} = \frac{c}{Nf_{r[i]} + f_o}$$

$$\lambda_{2[i]} = c/f_{2[i]}, \lambda_1 = c/f_1$$

wherein, $\lambda_1$ is a laser wavelength of the reference laser, $\lambda_{2[i]}$ is a laser wavelength of the tunable laser after the i-th adjustment for the modulation frequency of the high-frequency electro-optic phase modulator, and c is the speed of light in vacuum;

the magnitude of the synthetic wavelength is determined by the modulation frequency $f_{r[i]}$ of the high-frequency electro-optic phase modulator, every time after the modulation frequency $f_{r[i]}$ of the high-frequency electro-optic phase modulator is dynamically adjusted, the i-th synthetic wavelength and the i−1th synthetic wavelength are used to construct a second-level synthetic wavelength $\lambda_{SS[i]}$, formula is as follows:

$$\lambda_{ss[i]} = \left| \frac{\lambda_{s[i]} \cdot \lambda_{s[i-1]}}{\lambda_{s[i]} - \lambda_{s[i-1]}} \right| = \frac{c}{N\Delta f_{r[i]}}$$

$$\Delta f_{r[i]} = f_{r[i]} - f_{r[i-1]}$$

wherein, $\Delta f_{r[i]}$ represents an i-th frequency dynamic adjustment increment of the high-frequency electro-optic phase modulator, $\Delta f_{r[i]} > 0$;

step 4, in the sinusoidal phase modulation interferometer measurement module, interference signals of the reference laser and the tunable laser are detected by a first photodetector and a second photodetector respectively, and then sampled by a first analog-to-digital converter and a second analog-to-digital converter, and then enter a field programmable gate array signal processor for phase demodulation, phases of the interference signals of the reference laser and the tunable laser are obtained, and a phase of the synthetic wavelength and a phase of the second-level synthetic wavelength are calculated as follows:

$$\varphi_{s[i]} = \varphi_{2[i]} - \varphi_1 = \frac{4\pi}{\lambda_{s[i]}} L$$

$$\varphi_{ss[i]} = \varphi_{s[i-1]} - \varphi_{s[i]} = \frac{4\pi}{\lambda_{ss[i]}} L$$

wherein, L represents a distance to be measured of a measuring mirror in the sinusoidal phase modulation interferometer measurement module, $\varphi_1$ represents the phase of the interference signal of the reference laser, $\varphi_{2[i]}$, $\varphi_{S[i]}$ and $\varphi_{SS[i]}$ respectively indicate the phase of interference signal of the tunable laser after i-th adjustment for the modulation frequency of the high-frequency electro-optic phase modulator, the phase of the synthetic wavelength and the phase of the second-level synthetic wavelength;

step 5, after the modulation frequency of the high-frequency electro-optic phase modulator is dynamically adjusted for the i=1 time, an initial measurement result of a corresponding absolute distance is obtained according to the second-level synthetic wavelength and a corresponding phase, formula is as follows:

$$L_1 = \lambda_{ss[1]} \cdot \frac{\varphi_{ss[1]}}{4\pi}$$

after the i-th dynamic adjustment is performed for the modulation frequency of the high-frequency electro-optic phase modulator, i>1, according to a synthetic wavelength transition theory, measurement results of absolute distance are expressed as follows:

$$L_i = \left(\text{int}\left[\frac{2L_{i-1}}{\lambda_{ss[i]}} - \frac{\varphi_{ss[i]}}{2\pi}\right] + \frac{\varphi_{ss[i]}}{2\pi}\right) \bullet \frac{\lambda_{ss[i]}}{2}, i = 2, 3 \ldots M$$

wherein, int[ ] means rounding up;

step 6, steps 3, 4, and 5 are repeated for a total of M times, and finally the measurement result is obtained as a final absolute distance $L_M$.

* * * * *